United States Patent
Marmillion et al.

(10) Patent No.: US 6,333,546 B1
(45) Date of Patent: Dec. 25, 2001

(54) MICRO FUSIBLE LINK FOR SEMICONDUCTOR DEVICES AND METHOD OF MANUFACTURE

(75) Inventors: Patricia Marmillion, Colchester; Anthony M. Palagonia, Underhill; Dennis A. Schmidt, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/692,539

(22) Filed: Oct. 20, 2000

Related U.S. Application Data

(62) Division of application No. 09/074,353, filed on May 7, 1998.

(51) Int. Cl.⁷ .................................................. H01L 29/00
(52) U.S. Cl. .............................................. 257/529; 438/601
(58) Field of Search ................................ 257/529, 536, 257/537, 665, 910; 438/601

(56) References Cited

U.S. PATENT DOCUMENTS

| | | | |
|---|---|---|---|
| 3,619,725 | 11/1971 | Soden et al. | 317/101 A |
| 3,699,403 * | 10/1972 | Boleky, III | 317/235 R |
| 3,881,241 | 5/1975 | Masuda et al. | 29/574 |
| 4,042,950 | 8/1977 | Price | 357/51 |
| 4,135,295 | 1/1979 | Price | 29/623 |
| 4,198,744 * | 4/1980 | Nicolay | 29/623 |
| 4,460,914 | 7/1984 | te Velde et al. | 357/51 |
| 4,652,848 * | 3/1987 | Hundrieser | 337/297 |
| 4,682,204 | 7/1987 | Shiozaki et al. | 357/51 |
| 4,796,075 | 1/1989 | Whitten | 357/51 |
| 4,814,853 * | 3/1989 | Uchida | 357/51 |
| 4,873,506 | 10/1989 | Gurevich | 337/290 |
| 5,256,899 | 10/1993 | Rangappan | 257/665 |
| 5,389,814 * | 2/1995 | Srikrishnan et al. | 257/529 |
| 5,420,455 | 5/1995 | Gilmour et al. | 257/529 |
| 5,444,287 | 8/1995 | Bezama et al. | 257/467 |
| 5,585,663 | 12/1996 | Bezama et al. | 257/529 |
| 5,618,750 | 4/1997 | Fukuhara et al. | 438/601 |
| 5,621,375 | 4/1997 | Gurevich | 337/297 |
| 5,625,218 | 4/1997 | Yamadera et al. | 257/529 |
| 5,627,400 | 5/1997 | Koga | 257/529 |
| 5,939,969 * | 8/1999 | Doerrwaechter et al. | 337/297 |
| 5,963,825 | 10/1999 | Lee et al. | 438/601 |
| 6,207,938 * | 3/2001 | Taylor et al. | 219/505 |

OTHER PUBLICATIONS

IBM Technical Disclosure Bulletin, vol. 29, No. 3 Aug. 1986, pp. 1291–1292.

* cited by examiner

*Primary Examiner*—David Nelms
*Assistant Examiner*—Quoc Hoang
(74) *Attorney, Agent, or Firm*—McGuireWoods, LLP; Daryl K. Neff

(57) ABSTRACT

An electrically activated fuse with a high melting point heater element in series with a low melting point fusible link. The heater element has a higher resistivity and larger cross-sectional area than the fusible link in order to withstand heat that the heater element generates bringing the fusible link to its melting point. Fuse dimensions (width and length) are each between 0.1 and 2.0 microns, with a thermal mass of the heater element being sufficient to melt the fusible link.

6 Claims, 5 Drawing Sheets

MICRO FUSIBLE LINK FOR SEMICONDUCTOR DEVICES AND METHOD OF MANUFACTURE

This application is a division of U.S. patent application Ser. No. 09/074,353 filed May 7, 1998.

BACKGROUND OF THE INVENTION

1. Field of the Invention

The present invention is related to semiconductor devices with heat-fusible elements and, more particularly, to a method of forming heat-fusible elements on integrated circuit (IC) chips.

2. Background Description

Semiconductor fusible links are used for both activating redundancy in memory chips and for programming functions and codes in logic chips. Typical fusible links may are large structures blown by eternal heat, e.g. from a laser, or from electrical current passed through the fuse.

A typical laser blown fuse is 1 µm wide by 8 µm long. Also, because of the size of the laser spot used to program the fuses, laser blown fuse links must be spaced some distance apart (approximately 10 µm) and, in some instances, guard structures must be placed between fuses to prevent damage to adjacent fuses.

Typically, state of the art electrically blown fusible links, must not melt at normal operating current/voltage chip conditions to avoid inadvertently blown fuses. So, state of the art electrically programmed fuses require relatively large currents to open the fuse link. Therefore, higher current/voltage levels are supplied, typically, by external sources to program electrically blown fuses.

One way of facilitating melting fuse links is to provide a resistive heat source under the fusible link. See, for example, U.S. Pat. No. 4,814,853 entitled "Semiconductor Device With Programmable Fuse" to Uchida. Uchida teaches placing a fusible link on a thin insulator above a resistive wire. The resistive wire heats the fusible link to near its melting point and current passing through the link opens it. Unfortunately, Uchida requires that two sets of wires be provided to each fusible link, one for the fusible link and the other for the heater. Also, some of the heat generated in the resistive wire is partially thermally insulated by the insulating film dissipates into the chip below it.

Consequently, state of the art fusible link structures currently use a significant amount of chip surface area. Space is also required to provide clearance for the physical disruption of the link and its surrounding area that may occur when the fusible link is blown. Thus, the area above and around the fusible link must be kept clear. There is a limit to wiring that can occur under the fusible link as well. As circuit density increases and chip sizes decreases, the area occupied by large fusible links remains a problem.

Thus, there is a need for a very small and compact fusible link that uses less chip surface space.

SUMMARY OF THE INVENTION

It is a purpose of the invention to provide an electrically fusible link that is small in size;

It is another purpose of the present invention to allow more and/or denser arrangements of fusible links;

It is yet another purpose of the present invention to reduce the current/voltage required to fuse fusible links.

The present invention is an electrically programmed fuse and the method of manufacture thereof. The preferred fuse structure includes a high melting point heater element in series with a low melting point fusible link. The heater element has a higher resistivity and larger cross-sectional area than the fusible link in order to withstand heat that the heater element generates to bring the fusible link to its melting point, with a thermal mass of the heater element being sufficient to melt the fusible link. The fuse may be formed on or in the surface of an integrated circuit (IC) chip. Preferred fuse dimensions (width and length) are each between 0.1 and 1 micron.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1A:
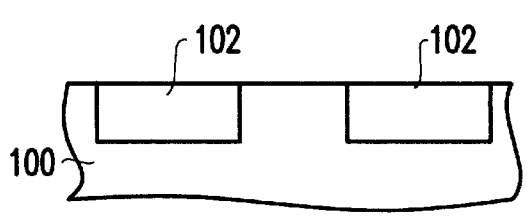
FIGS. 1A–E show the steps of a first preferred embodiment method of forming fuses through a cross-sectional area of a semiconductor chip.

Referring now to the drawings, and more particularly to FIG. 1A–E which show the steps of a first preferred embodiment method of forming fuses through a cross-sectional area of a semiconductor chip. FIGS. 2A–E show a top view of the steps of the first preferred embodiment method of forming fuses at each of the steps of FIGS. 1A–E.

Figure 2A:
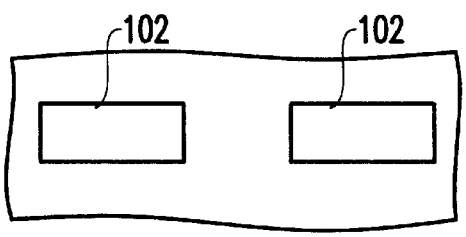
FIGS. 2A–E show a top view of the steps of the first preferred embodiment method of forming fuses at each of/the steps of FIGS. 1A–E.
Figure 1B:
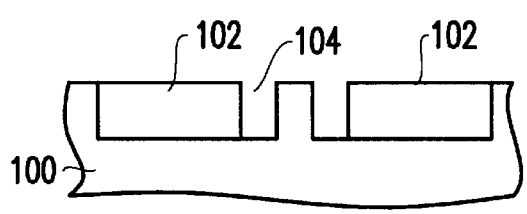
Figure 2B:
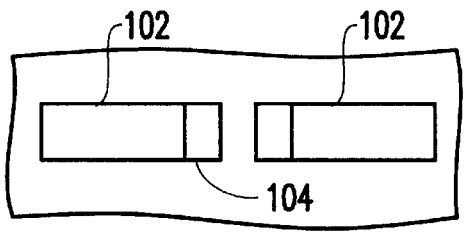
Figure 1C:
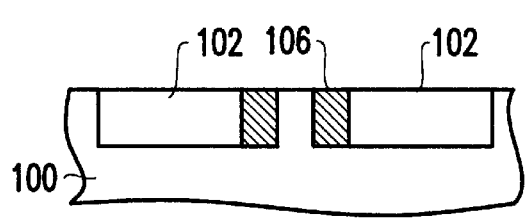
Figure 2C:
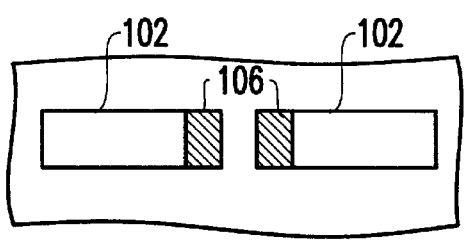
Figure 1D:
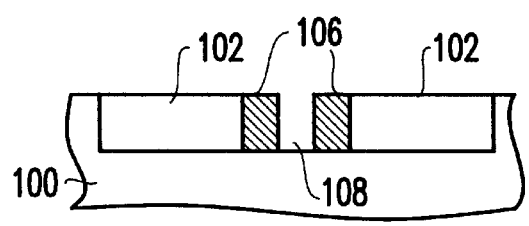
Figure 2D:
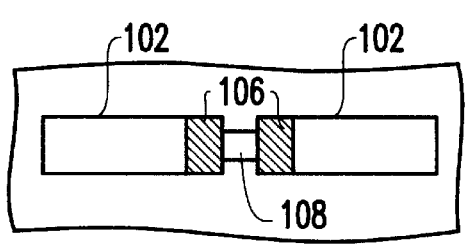
Figure 1E:
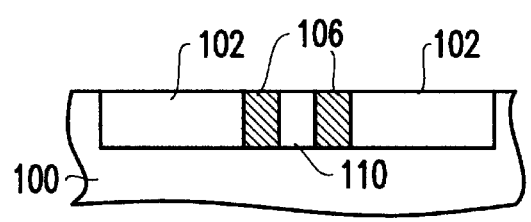

First, in FIGS. 1A and 2A an oxide surface layer 100 is recessed and metal contacts 102 are formed in the recessed surface. Preferably, the metal contacts 102 are copper, aluminum, tungsten or, composite films of Ti/AlCu, Ti/TiN/AlCu or any suitably metal or metal alloy. Next, in FIGS. 1B and 2B trenches 104 are formed in oxide surface layer 100 between two contacts 102, spaced apart by 0.1–1.0 µm of oxide. In FIGS. 1C and 2C, trenches 104 are filled with resistive element 106, and in FIGS. 1D and 2D a second trench 108, preferably as deep as trenches 104 (0.5–2.0 μm) is formed between the resistive elements 106. Finally, in FIGS. 1E and 2E fuse material 110 is deposited into the second trench 108.

Figure 2E:
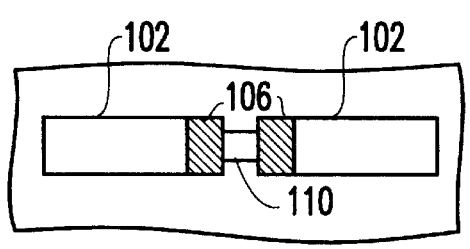
Figure 3A:
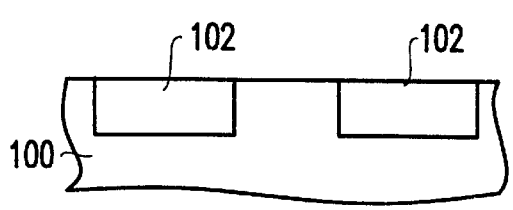
FIGS. 3A–E show the steps of a second preferred embodiment method of forming fuses through a cross-sectional area of a semiconductor chip.
Figure 4A:
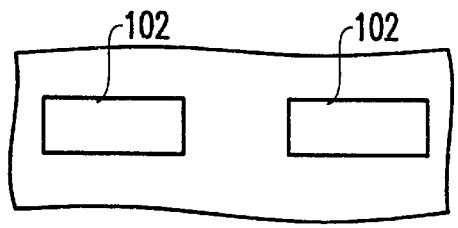
FIGS. 4A–E show a top view of the steps of the second preferred embodiment method of forming fuses at each of the steps of FIGS. 3A–E.
Figure 3B:
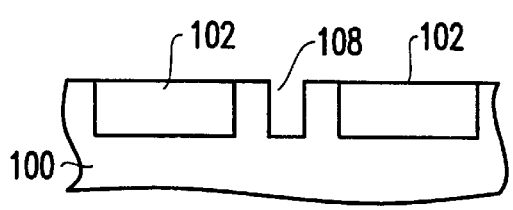
Figure 4B:
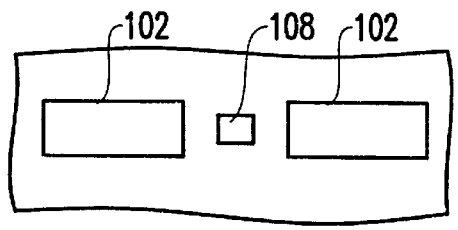
Figure 3C:
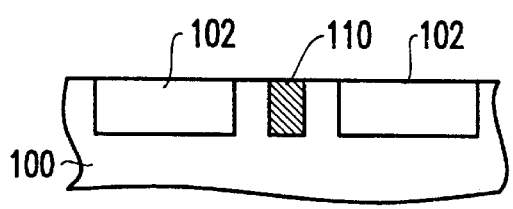
Figure 4C:
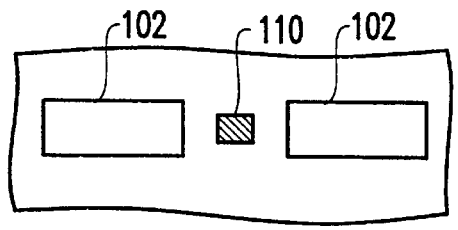
Figure 3D:
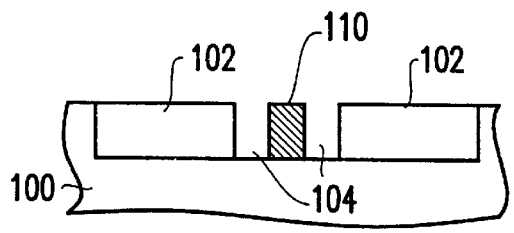
Figure 4D:
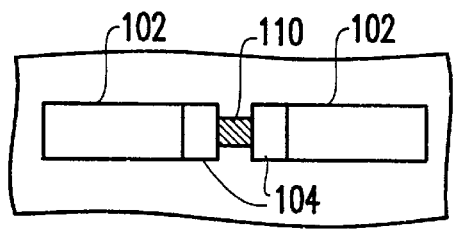
Figure 3E:
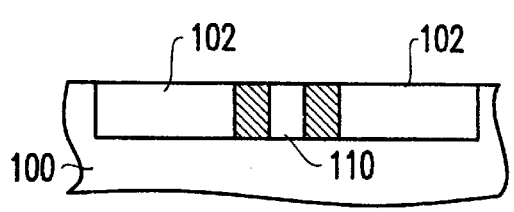
Figure 4E:
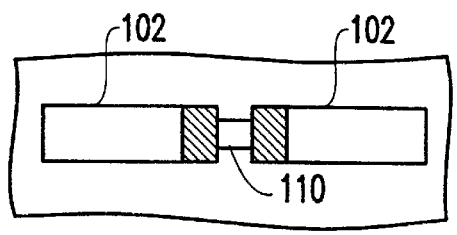

The volume of the preferred fusible element 110 is minimized, while its contact area with the resistive element is maximized. The preferred width and length of the fusible link in FIG. 2E is between 0.1–1.0 μm. When passing current through the preferred fusible link, most heat generated in resistive heating elements 106 is thermally insulated from other structures and so, dissipates into the fusible links 110 and the contacts 102, which have a high thermal mass compared to the fusible links 110. Consequently, the fusible link's temperature will be higher than the contacts 102 or the resistive heating elements 106.

Preferably, the resistive element 106 (or heater element) of the fusible link has a high melting point and a high resistivity. The resistive element 106 generates heat easily but does not dissipate heat by changing states, i.e., by melting. Therefore, energy so generated transfers to the fusible element 110 sandwiched between and in contact with heating elements 106. Thus, the preferred fusible element 110 is selected to have a comparatively low melting point. Also, the preferred fusible element 110 has a comparatively high resistivity, although a low resistivity is acceptable.

Suitable preferred resistive element 106 materials include:

| Material | Melting Point | Resistivity Ω-cm |
|---|---|---|
| Tantalum | 2996° C. | $13 \times 10^{-6}$ |
| Titanium | 1800° C. | |
| Tungsten | 3370° C. | $5 \times 10^{-6}$ |
| Titanium Nitride | 2930° C. | $21.7 \times 10^{-6}$ |
| Titanium Nitride | 3090° C. | $135 \times 10^{-6}$ |
| Titanium Silicide | 1540° C. | $123 \times 10^{-6}$ |
| Titanium Silicide | 2050° C. | $33 \times 10^{-6}$ |
| Doped Polysilicon | 1420° C. | $1 \times 10^{4}$ Intrinsic |
| | | $1 \times 10^{2}$ @ $10^{14}$ atm/cm$^3$ |
| | | $1$ @ $10^{16}$ atm/cm$^3$ |
| | | $1 \times 10^{-2}$ @ $10^{18}$ atm/cm$^3$ |
| | | $1 \times 10^{-4}$ @ $10^{21}$ atm/cm$^3$ |

Suitable preferred fusible link 110 materials include:

| Material | Melting Point | Resistivity Ω-cm |
|---|---|---|
| Copper | 1083° C. | $2 \times 10^{-6}$ |
| Aluminum | 660° C. | $2.8 \times 10^{-6}$ |
| Bismuth | 271° C. | $120 \times 10^{-6}$ |
| Indium | 156° C. | $8 \times 10^{-6}$ |
| Tin | 231° C. | $11.5 \times 10^{-6}$ |

Preferably, materials with a melting point that falls between characteristically low melting point (LMP) and high melting point (HMP) materials may be used either for the heater elements 106 or the fusible link 110, depending upon the material composition of the other element. For example, lightly doped or intrinsic polycrystalline silicon (poly-Si) may be used as the HMP heater element 106 when combined with a fusible link 110 of an LMP metal such as tin. Alternatively, more heavily doped poly-Si can be used as the fusible link 110 in combination with a heater element 106 of tungsten.

FIGS. 3A–E show the steps of a second preferred embodiment method of forming fuses through a cross-sectional area of a semiconductor chip. FIGS. 4A–E show the steps of the second preferred embodiment method of forming fuses at each of the steps of FIGS. 3A–E. The second preferred method is essentially the same as the first except that the fusible element 110 is formed immediately after forming contacts 102, instead of last. Thus, FIGS. 3B–C and 4B–C correspond to FIGS. 1D–E and 2D–E, respectively, and FIGS. 3D–E and 4D–E correspond to FIGS. 1B–C and 2B–C, respectively. The second preferred method provides better dimensional control for the fusible link 110.

Alternatively, the fusible link of either embodiment may be of the same material as the contact 102. Thus, for example, both may be copper.

Figure 5A:
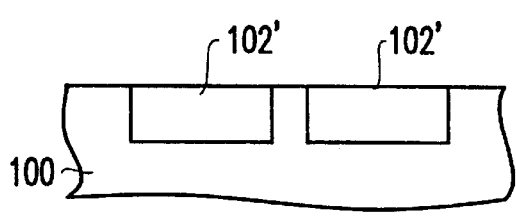
FIGS. 5A–C show the steps of a third preferred embodiment method of forming fuses through a cross-sectional area of a semiconductor chip.
Figure 6A:
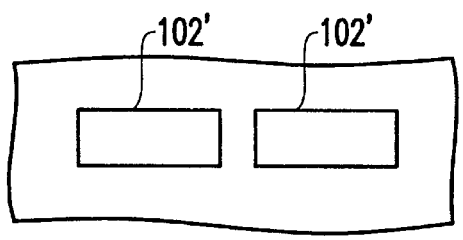
FIGS. 6A–C show a top view of the steps of the third preferred embodiment method of forming fuses at each of the steps of FIGS. 5A–C.
Figure 5B:
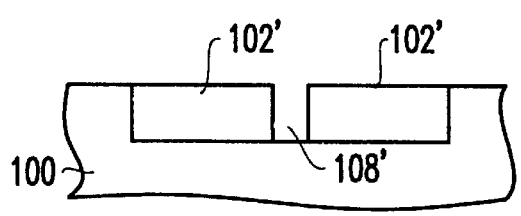
Figure 6B:
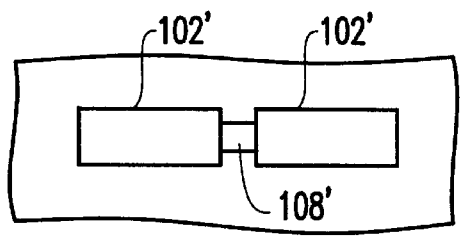
Figure 5C:
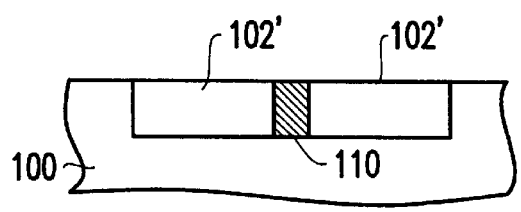
Figure 6C:
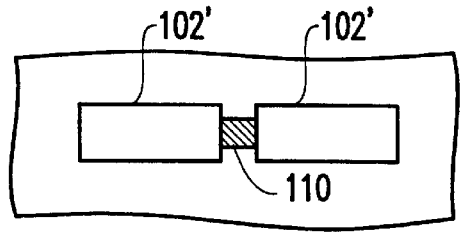
Figure 7A:
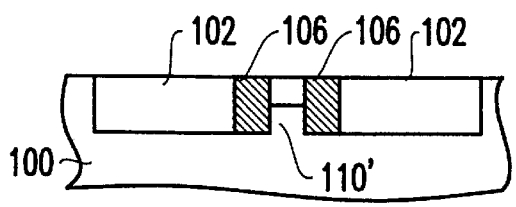
FIGS. 7A–B show a first variation of the preferred embodiment fuse.
Figure 7B:
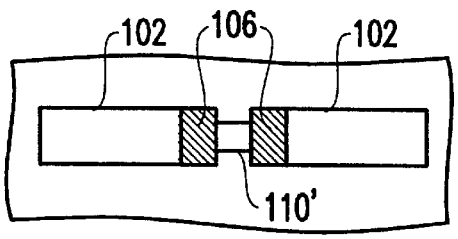
Figure 8A:
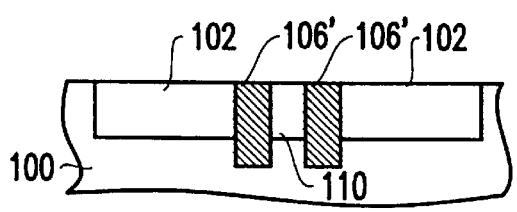
FIGS. 8A–B show a second variation of the preferred embodiment fuse.
Figure 8B:
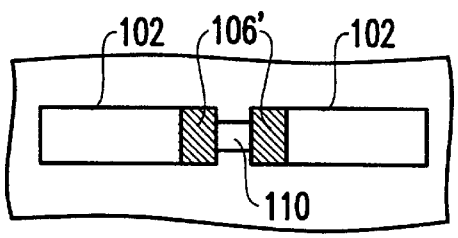

FIGS. 5A–C show the steps of a third preferred embodiment method of forming fuses through a cross-sectional area of a semiconductor chip. FIGS. 6A–C show the steps of the second preferred embodiment method of forming fuses at each of the steps of FIGS. 5A–C. In this embodiment, the contacts 102' are extended and also act as a resistive element, eliminating the requirement for a separate resistive heating elements 106 of the first two preferred embodiments. For this preferred embodiment, it is critical for the contact/resistive element 102' to have a melting point much higher than the fusible link 110 material. The preferred fusible link 110 material for this embodiment is bismuth, which has high resistivity and a low melting point compared to other materials.

Figure 9A:
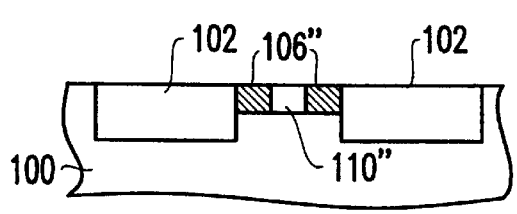
FIGS. 9A–B show a third variation of the preferred embodiment fuse.
Figure 9B:
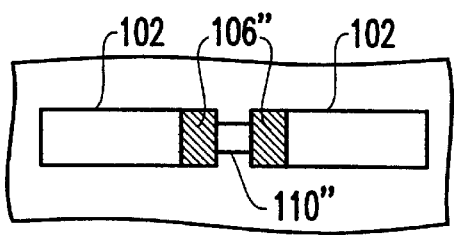
Figure 10A:
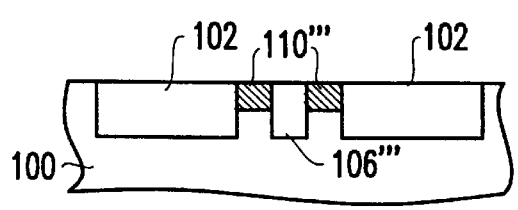
FIGS. 10A–B show a fourth variation of the preferred embodiment fuse.
Figure 10B:
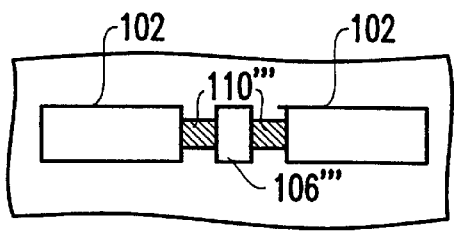
Figure 12A:
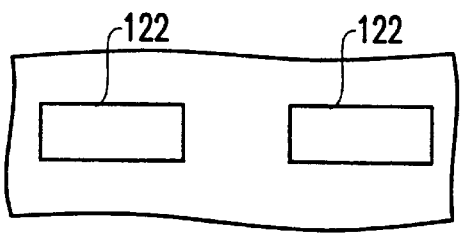
FIGS. 12A–D show a top view of the steps of the alternate embodiment method of forming fuses at each of the steps of FIGS. 11A–D.

FIGS. 7A–B, 8A–B, 9A–B and 10A–B show two variations on fusible links made according to the first two preferred embodiments. In these variations, the size ratio of the resistive elements 106, 106', 106'' and 106''' to the fusible element 110', 110, 110'' and 110''', respectively, is maintained or increased. Thus, in FIGS. 7A–B, the depth of the fusible link 110' is reduced and in FIGS. 8A–B resistive elements 106' are extended. In FIGS. 9A–B, the depth of both the resistive elements 106'' and the fusible link 110'' is reduced to reduce the possibility of damage to underlying structures during programming. In FIGS. 10A–B, the location of heater element 106''' is swapped with and surrounded by two fusible links 110'''.

Figure 11A:
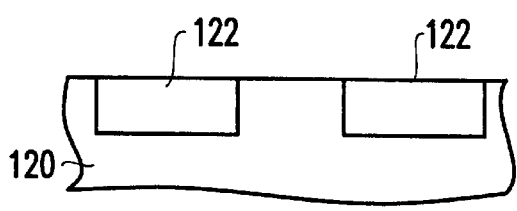
FIGS. 11A–D show the steps of an alternate embodiment method of forming fuses through a cross-sectional area o a semiconductor chip.
Figure 11B:
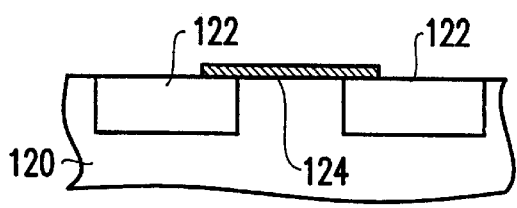
Figure 12B:
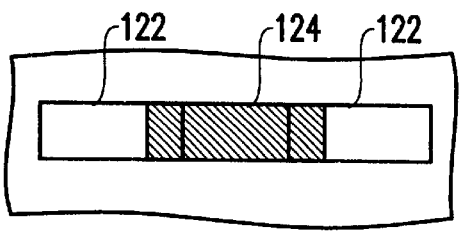
Figure 11C:
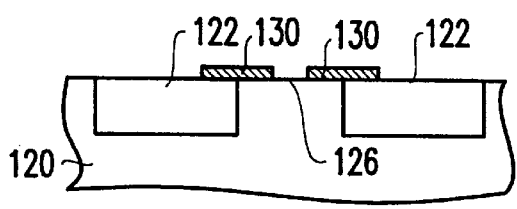
Figure 12C:
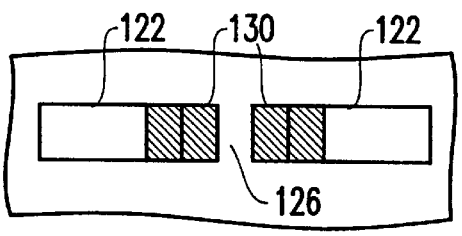
Figure 11D:
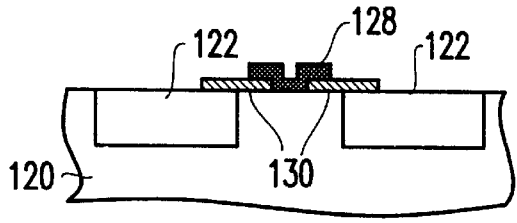
Figure 12D:
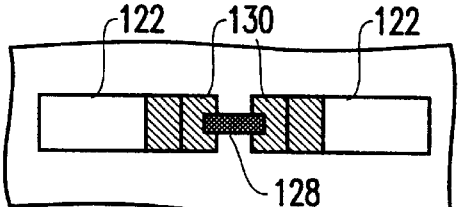

FIGS. 11A–D show the steps of an alternate embodiment method of forming fuses through a cross-sectional area of a semiconductor chip. FIGS. 12A–D show the steps of the alternate embodiment method of forming fuses at each of the steps of FIGS. 11A–D. In this embodiment, in FIGS. 11A and 12A contacts 122 are formed in an oxide layer 120. In FIGS. 11B and 12B, a strip of resistive material 124 is formed on the oxide layer 120 spanning oxide between the metal contacts 122. In FIGS. 11C and 12C a gap 126 is formed in the resistive strip 124. Finally, in FIGS. 11D and 12D, a fusible element 128 is formed over the gap 126 on the oxide layer 120 between resistive element segments 130. In this embodiment, it is preferable that the fusible element be thin as well as narrow. The preferred fusible link's width and thickness is between 0.1–2.0 μm and most preferably, 0.1–0.5 μm.

While the invention has been described in terms of preferred embodiments, those skilled in the art will recognize that the invention can be practiced with modification within the spirit and scope of the appended claims.

We claim:

1. A fusible link comprising:
   a resistive element;
   a fusible element contacting said resistive element, whereby a programming current passing through said resistive element and said fusible element heats said resistive element to a temperature at least at the melting point of said fusible element, heat from said resistive element and said programming current opening said fusible element.

2. The fusible link of claim 1, wherein said resistive element is a pair of resistive elements on opposite sides of said fusible link.

3. The fusible link of claim 1, wherein said fusible link is a pair of fusible links on opposite sides of said resistive element.

4. The fusible link of claim 2, wherein said fusible link has a surface area between 0.01–1 $\mu m^2$.

5. The fusible link of claim 2 wherein the resistive element material is selected from the group consisting of tantalum, titanium, tungsten, titanium nitride, titanium silicide and doped polysilicon.

6. The fusible link of claim 2 wherein the fusible link material is selected from the group consisting of copper, aluminum, bismuth, indium and tin.

* * * * *